United States Patent [19]
Schulze

[11] Patent Number: 6,043,516
[45] Date of Patent: Mar. 28, 2000

[54] SEMICONDUCTOR COMPONENT WITH SCATTERING CENTERS WITHIN A LATERAL RESISTOR REGION

[75] Inventor: Hans-Joachim Schulze, Ottobrunn, Germany

[73] Assignee: Eupec Europaeische Gesellschaft fuer Leistungshalbleiter mbH & Co. KG, Warstein-Belecke, Germany

[21] Appl. No.: 08/940,471

[22] Filed: Sep. 30, 1997

[30] Foreign Application Priority Data

Sep. 30, 1996 [DE] Germany ................ 196 40 311

[51] Int. Cl.[7] .................... H01L 29/74; H01L 29/04; H01L 29/30
[52] U.S. Cl. .................. 257/174; 257/107; 257/173; 257/148; 257/154; 257/162; 257/157; 257/536; 257/617
[58] Field of Search ................ 257/174, 173, 257/148, 107, 131, 154, 157, 162, 536, 537, 538, 543, 617

[56] References Cited

U.S. PATENT DOCUMENTS

| | | | |
|---|---|---|---|
| 3,902,926 | 9/1975 | Perloff et al. | 148/1.5 |
| 4,040,170 | 8/1977 | Schlegel et al. | 29/577 |
| 4,117,505 | 9/1978 | Nakata | 357/28 |
| 4,210,464 | 7/1980 | Tanaka et al. | 148/1.5 |
| 4,224,083 | 9/1980 | Cresswell | 148/1.5 |
| 4,234,355 | 11/1980 | Meinders | 148/1.5 |
| 4,908,687 | 3/1990 | Temple | 357/38 |
| 4,969,028 | 11/1990 | Baliga | 357/38 |
| 5,243,205 | 9/1993 | Kitagawa et al. | 257/173 |
| 5,587,594 | 12/1996 | Jacklin et al. | 257/138 |

FOREIGN PATENT DOCUMENTS

| | | |
|---|---|---|
| 0 389 863 B1 | 10/1990 | European Pat. Off. . |
| 0472880A2 | 3/1992 | European Pat. Off. . |
| 3913123A1 | 10/1990 | Germany . |
| 2207552A | 2/1989 | United Kingdom . |

OTHER PUBLICATIONS

"Advanced Light Triggered Thyristors for Electric Power Systems" (Temple), IEE Int. Conference Thyristor and Variable Static Equipment for AC and DC Transmission, Nov. 30, 1981, pp. 86–91.

Primary Examiner—Jerome Jackson, Jr.
Assistant Examiner—B W. Baumeister
Attorney, Agent, or Firm—Herbert L. Lerner; Laurence A. Greenberg; Werner H. Stemer

[57] ABSTRACT

A semiconductor component has a semiconductor body with at least one integrated lateral resistor. The lateral resistor is formed with a dopant concentration in the resistor region. The resistor region is located in a region which is accessible from the surface of the semi-conductor component and it has a defined dopant concentration. Scattering centers are provided in the region of the lateral resistor which reduce a temperature dependency of the lateral resistor.

13 Claims, 1 Drawing Sheet

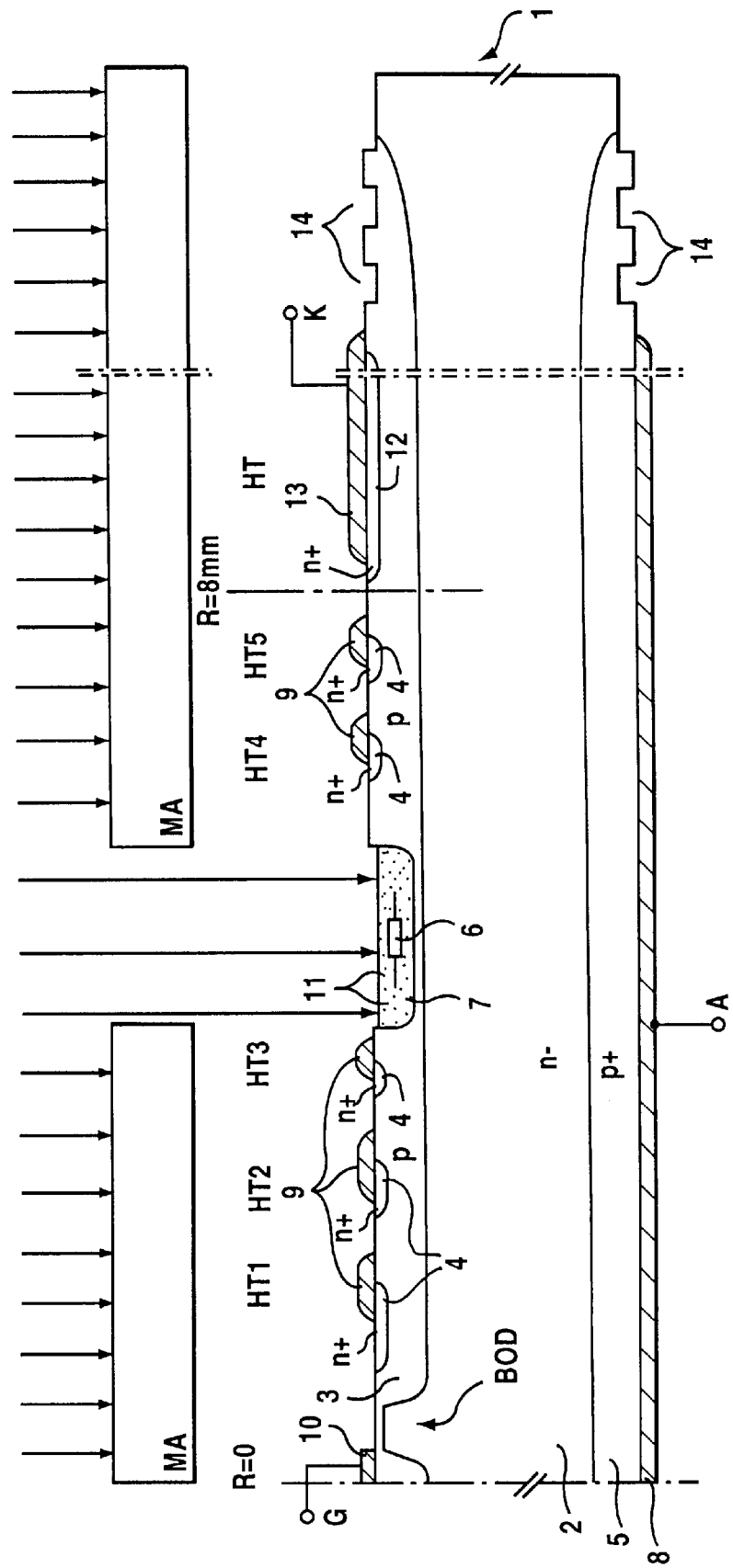

SEMICONDUCTOR COMPONENT WITH SCATTERING CENTERS WITHIN A LATERAL RESISTOR REGION

BACKGROUND OF THE INVENTION

1. Field of the Invention

The invention pertains to a semiconductors. In particular, the invention pertains to a semiconductor component formed of a semiconductor body and having at least one integrated lateral resistor with the following characteristics:

the lateral resistor is due to a dopant concentration in the resistor region;

the resistor region is located in an area accessible from the surface of the semiconductor component; and the resistor region has a defined dopant concentration.

The invention further pertains to a method of producing such a semiconductor component with a lateral resistor.

2. Description of the Related Art

Lateral resistors play a major role in power semiconductor components. Typically, lateral resistors are integrated into power thyristors, in order to limit the current rise speed (di/dt) during thyristor turn-on. Without these lateral resistors as current limiters, the semiconductor components could be destroyed.

From the conference proceedings of the "IEEE International Conference: Thyristors and Variable and Static Equipment for AC and DC Transmission"; Nov. 30 to Dec. 3, 1981, in London, and the paper in it by V. A. K. Temple (GE) entitled "Advanced Light Triggered Thyristors for Electric Power Systems", especially p. 90, FIG. 7 and p. 91, FIG. 10, a semiconductor component of this generic type and a method for its production are known. The semiconductor component is in particular a power thyristor with an amplifying gate structure. In that thyristor, a defined lateral resistor is created by first forming a p-base by diffusion and then etching the p-base thinner at the site where the resistor is to be made.

European patent disclosure EP 0 472 880 also discloses a semiconductor component of that type. There, a thyristor with a lateral resistor is disclosed whose resistor region has a defined, lesser dopant concentration as compared to the layer surrounding it. Typically, the resistors integrated into semiconductor components are created by in-diffusion or implantation of dopant atoms, such as boron or aluminum. In the case where the dopant atoms are introduced by ion implantation, for example, the resistance can be controlled via the selected dose. If the dopant atoms are introduced by diffusion, then structured etching of the dopant layers is an option for purposeful adjustment of the resistance. A method of this type is described in detail in EP 0 472 880. It is entirely possible to create lateral resistors with readily replicable resistances.

Particularly the lateral resistors made by special doping processes, however, sometimes heat up severely during the flow of current because of the Joule effect. The resistance of the lateral resistor increases because the number of phonons increases with the temperature and hence with the scattering of the phonons. Because of the increased resistance, the dissipation rises in turn, and so forth. If the stress is severe, this lockstep increase in resistance and temperature, the one causing the other to rise and vice versa, can lead to the destruction of the semiconductor component.

SUMMARY OF THE INVENTION

It is accordingly an object of the invention to provide a semiconductor component with a lateral resistor, which overcomes the above-mentioned disadvantages of the prior art devices and methods of this general type and the lateral resistor of which is largely temperature-independent in the temperature range of component operation and can be integrated in a readily replicable way in the semiconductor component at minimal process effort or expense.

With the foregoing and other objects in view there is provided, in accordance with the invention, a semiconductor component, comprising:

a semiconductor body having a resistor region formed therein which is accessible from a surface of the semiconductor body;

at least one lateral resistor integrated in a the semiconductor body, the lateral resistor being defined by a dopant concentration in the resistor region; and scattering centers provided in the resistor region for reducing a temperature dependency of the lateral resistor.

In other words, the lateral resistor has scattering centers in the region of the lateral resistor that reduce the temperature dependency of the lateral resistor. The resistor is disposed concentrically and has a length of 2 mm, for instance.

In accordance with an added feature of the invention, the scattering centers are defects in a crystal lattice of the semiconductor body, the defects being formed by irradiation with non-doping, high-energy particles.

In accordance with an additional feature of the invention, the defects are created by defined irradiation of the semiconductor body with energetic particles selected from the group consisting of a-particles, protons, and electrons.

In accordance with another feature of the invention, the defects are created by defined irradiation of the semiconductor body with oxygen ions and/or silicon ions.

In other words, the scattering centers are essentially defects, which are created by irradiation with non-doping, high-energy particles, such as α-particles, protons or electrons. If very severe damage to the crystal is desired, the semiconductor body can also be irradiated with heavy particles, such as oxygen ions, silicon ions, or similar particles. Because of the possibility of easy acceleration of the particles, a high-energy ion implanter is preferably used as the irradiation source. However, it is also conceivable to use uncharged particles, such as neutrons, for the irradiation.

In accordance with a further feature of the invention, the defects are crystal lattice defects selected from the group consisting of Frenkel defects, Schottky defects, oxygen vacancy complexes, and double vacancies. Frenkel defects and Schottky defects are point defects in the crystal lattice, which are expressed as vacancies. A Frenkel defect is a vacancy in which the associated atom is located at an interstice in the vicinity of the vacancy. If the atom belonging to a vacancy has migrated to the surface, then a Schottky defect is present. However, still other defects are also conceivable, such as oxygen vacancy complexes or double vacancies.

As noted in the foregoing, the semiconductor component may be a thyristor. In accordance with again an added feature of the invention, the semiconductor body has formed therein a plurality of thyristor structures including at least one gate electrode, one cathode, and one anode. Particularly in thyristors with high switching currents, integrated lateral resistors as current limiters play a very major role and thus prevent the destruction of the component.

In accordance with again another feature of the invention, the thyristor is a multiple stage thyristor including at least one main thyristor and at least one auxiliary thyristor. Thyristors with a so-called amplifying gate structure comprise a parallel circuit of at least one main thyristor and at least one auxiliary thyristor. Multistage thyristors with an amplifying gate structure are advantageous particularly at low trigger currents in the primary triggering range of the thyristors, as for example in light triggered thyristors. The light pulse can be generated for instance by a laser or a laser diode.

In accordance with again an additional feature of the invention, the thyristor is an annular thyristor, and the thyristor structures in a plane of the surface of the semiconductor body are annular structures selected from the group consisting of circular, circular-annular, and polygonal.

The annular thyristor (e.g. a ring thyristor) provides for uniform flow of current through it and a higher switchable power of the thyristor.

In accordance with yet a further feature of the invention, the semiconductor component has a center region defined on the semiconductor body, and including a voltage break-over protection in the center region. These voltage break-over protection structures are embodied as a curvature of the p-n junction between the anode-side and the cathode-side base zones and serve as a means of overvoltage protection for the semiconductor component.

In accordance with a further feature there are recesses formed on the periphery of the semiconductor component. These recesses define a peripheral structure, by which the occurrence of a premature avalanche breakthrough in the peripheral region of the semiconductor component is averted.

In accordance with a further feature the lateral resistor may be disposed between each of the main and auxiliary thyristors. It is also conceivable for a plurality of lateral resistors to be provided. In other words, the semiconductor component is a multiple stage thyristor including a one or more main thyristor and one or more auxiliary thyristor. The lateral resistor is thereby disposed between the auxiliary thyristors and/or between an auxiliary thyristor and the main thyristor.

With the above and other objects in view there is also provided, in accordance with the invention, a process for producing a lateral resistor in a resistor region of a semiconductor component, wherein the semiconductor component has a cathode side and the lateral resistor is defined by a dopant concentration in the resistor region, the process which comprises:

forming scattering centers in the resistor region for reducing a temperature dependency of the lateral resistor, by:
masking the cathode side of the semiconductor component and covering regions of the semiconductor component outside the resistor region;
irradiating the masked semiconductor component on the cathode side with high-energy, non-doping particles; and
subsequently tempering the semiconductor body for stabilizing the scattering centers.

Due to the fact that the final resistance of the lateral resistor can be adjusted in the finished component, it is advantageously possible, if the resistance of the lateral resistor is too low, to readjust it in a simple way by repeating the irradiation.

To lower the temperature dependency of the lateral resistor integrated with the semiconductor component, the method described here seeks to reduce the influence of the scattering of the free charge carriers phonons.

In general, the resistance is adjusted via the specific resistance $\rho$. The specific resistance $\rho$ is inversely proportional to $\mu$ (directly proportional to $1/\mu$), where $\mu$ is the mobility of the free charge carriers. The mobility $\mu$, in very pure semiconductors, is predominantly limited by impacts with phonons, and in highly defective semiconductors by the impacts with lattice defects as well. The reciprocal mean time until a collision occurs is the sum of the reciprocal mean time until phonon scattering occurs and the reciprocal mean time until scattering of imperfections occurs.

Based on this knowledge, it is the concept of the invention to intentionally damage the semiconductor crystal in the resistor region so severely that in the range of the semiconductor component operating temperature the proportion of the impacts of the free charge carriers with lattice defects, whose density in contrast to the phonons is not temperature-dependent, as much as possible exceeds the proportion of impacts of the free charge carriers with phonons.

Such a controlled creation of defects in the region of the lateral resistor can be realized for instance by means of the described irradiation of the resistor region with high-energy particles.

Other features which are considered as characteristic for the invention are set forth in the appended claims.

Although the invention is illustrated and described herein as embodied in a semiconductor component with a lateral resistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE is a partial sectional view through a thyristor with a lateral resistor and an amplifying gate structure according to the invention.

DESCRIPTION OF THE PREFERRED EMBODIMENTS

Referring now to the sole FIGURE of the drawing, a semiconductor body 1, for instance a silicon wafer, includes a weakly n⁻-doped inner zone 2. The zone 2 is adjoined on the cathode side by a p-doped base zone 3. A plurality of n⁺-doped emitter zones 4, 12 are embedded in the base zone 3. In the present example, these are on the one hand the auxiliary emitter zones 4 of the auxiliary thyristors HT1–HT5, and the main emitter zone 12 of the main thyristor (HT). The auxiliary emitter zones 4 of the auxiliary thyristors HT1–HT5 are each contacted electrically via auxiliary emitter electrodes 9. The auxiliary emitter electrodes 9 also contact the base zone 3 on their outside. The main emitter zone 12 of the main thyristor HT is connected to the cathode terminal K via the main emitter electrode 13. In addition, the base zone 3 in the central region of the thyristor is contacted via a gate metallization 10. The gate metallization 10 is connected to the gate terminal G of the thyristor. The inner zone 2 is adjoined on the anode side by the p⁺-doped anode-side emitter zone 5. The anode-side emitter zone 5 is contacted over a large area via a typical metallization 8. The metallization 8 forms the anode terminal A.

In the base zone 3, an embedded region 7 is provided, which includes the lateral resistor 6. The embedded region 7 adjoins the surface of the semiconductor body 1. A precisely defined dopant dose has been introduced into the embedded region 7, for instance by ion implantation. The embedded region 7 will hereinafter be referred to as the resistor region 7. The dopant concentration in the resistor region 7 determines the resistance of the lateral resistor 6.

Scattering centers 11 are additionally introduced in the resistor region 7. The scattering centers 11 may be defects in the crystal lattice of the semiconductor, which have been created for instance by irradiation with non-doped, high-energy particles. For example, these examples may be α-particles or protons. If very major damage to the crystal is required, then the semiconductor body can also be irradiated with heavier particles, such as oxygen ions or silicon ions. However, neutral particles such as neutrons may also be used for the irradiation. A high-energy ion implanter can act as the irradiation source. By means of the irradiation, point defects, such as Frenkel defects or Schottky defects, are formed in the crystal lattice. A Frenkel defect is a vacancy in which the associated atom is located at an interstice in the lattice in the vicinity of the vacancy. If the atom belonging to a vacancy has migrated to the surface, then a Schottky defect is present. However, the irradiation can also be used to produce other, more severe defects, such as oxygen vacancy complexes or double vacancies.

Thus the resistance of the lateral resistor 6 is determined by the dopant concentration and by the concentration of the scattering centers 11 in the resistor region 7.

The thyristor shown in the FIGURE is annular in structure. It is assumed that the thyristor middle is at R=0 and the end of the amplifying gate structure is at R=8 mm. In the FIGURE, for the sake of simplicity, only the right-hand half of the thyristor cross section is shown. The thyristor comprises the five annular auxiliary thyristors HT1–HT5 with the amplifying gate structure, and the one main thyristor HT, which is arranged circular-annularly around the auxiliary thyristors HT1–HT5. In the present example, the resistor region 7 is located between the third and fourth auxiliary thyristors HT3, HT4. The gate electrode G, which contacts the base zone 3, is also located in the central region of the thyristor. In the center of the thyristor, the base zone 3 has a voltage breakover point BOD. The voltage break-over point BOD is embodied as a curvature of the p-n junction between the inner zone 2 and the base zone 3 and serves as an overvoltage protection for the semiconductor component. Annular recesses 14 may additionally be provided in the peripheral region of the thyristor, near the surface, for creating a peripheral structure. These peripheral structures prevent surface leakage currents from flowing out via the periphery of the semiconductor component.

The lateral resistor has the following function: If the gate terminal G receives a positive voltage compared to the cathode K, then first the auxiliary thyristors HT1–HT3 fire, and via the lateral resistor 6 the auxiliary thyristors HT4, HT5 subsequently fire as well. Finally the main thyristor HT fires. Thus the lateral resistor 6 is a current limiter at turn-on which prevents excessive currents that could lead to the destruction of the semiconductor component.

In the case of low triggering currents, multistage amplifying gate structures can also be used. Such multistage thyristors with an amplifying gate structure comprise a parallel circuit of a plurality of thyristors. For instance, if the first thyristor is fired, for instance by the gate voltage or a light pulse, then its anode current serves to fire the next thyristor, and so forth. Thus all the thyristors of the amplifying gate structure can be fired in succession.

Advantageously, one corresponding lateral resistor is provided in each individual stage of the amplifying gate structure, or in other words between each two auxiliary thyristors HT1–HT5 and between one auxiliary thyristor HT5 and the main thyristor HT.

The resistances in thyristors with an amplifying gate structure range in the order of magnitude of typically 20 to 50Ω. The resistors act as protective resistors and limit the current rise (di/dt) in the primary triggering range.

A preferred method for producing the scattering centers 11 in the resistor region 7 will now be described.

The semiconductor component, processed to completion, is masked on its cathode side. Since the lateral resistors of thyristors are relatively large in size, a structured metal baffle, for instance 3 mm thick, that covers the regions of the wafer surface outside the resistor region 7 can for instance be used as a mask MA. The semiconductor body 1 is irradiated on the cathode side with high-energy particles. This creates defects in the crystal lattice that act as scattering centers 11. The depth distribution of the defects acting as scattering centers can be controlled for instance by the choice of the irradiation energy. Particularly in the case of resistor structures that have a relatively great length in the vertical direction, for instance 80 μm, it is possible by repeated irradiation at different radiation energies to generate a homogeneous distribution of the scattering centers in the resistor region 7.

For reasons of stability, it is recommended that a temperature step be performed after the irradiation. In it, the semiconductor body is tempered at temperatures between 220 C. and 270° C. for a plurality of hours (for instance, 15 hours).

Instead of the irradiation technique, the local in-diffusion of non-doped atoms is also conceivable.

The resistance of the lateral resistor 6 is necessarily increased by the irradiation. Accordingly, the concentration of free charge carriers must therefore be increased as well in order to attain the desired resistance. This requires increasing the dopant concentration in the resistor region 7.

The method for producing a defined temperature-independent lateral resistor 6 can be employed both for light triggered thyristors and for thyristors that are controlled by a gate electrode. However, it can also optionally be employed in the production of other semiconductor components. It is particularly important in thyristors with an integrated voltage break-over protection (BOD structure).

A further important advantage in the use of the method of the invention is that the final resistance of the lateral resistor 6 can be adjusted in the finished component. For instance, if the resistance measurement after the first irradiation shows that the resistance is not yet high enough, then the resistance can be easily adjusted by means of re-irradiation.

What is claimed is:

1. A semiconductor component, comprising:
    a semiconductor body having a lateral resistor region integrated therein and having an adjacent region surrounding said lateral resistor region, said lateral resistor region adjoining a surface of said semiconductor body and having an electrical conductance being defined by a dopant concentration in said lateral resistor region, said dopant concentration in said lateral resistor region being lower than a dopant concentration in said adjacent region surrounding said lateral resistor region; and
    scattering centers with a density within said lateral resistor region sufficient to produce essentially temperature-independent characteristics of the electrical conductance of said lateral resistor region.

2. The semiconductor component according to claim 1, wherein said scattering centers are defects in a crystal lattice of said semiconductor body, said defects being formed by irradiation with non-doping, high-energy particles.

3. The semiconductor component according to claim 2, wherein said defects are created by defined irradiation of said semiconductor body with particles selected from the group consisting of α-particles, protons, and electrons.

4. The semiconductor component according to claim 2, wherein said defects are created by defined irradiation of said semiconductor body with particles selected from the group consisting of oxygen ions and silicon ions.

5. The semiconductor component according to claim 2, wherein said defects are crystal lattice defects selected from the group consisting of Frenkel defects, Schottky defects, oxygen vacancy complexes, and double vacancies.

6. The semiconductor component according to claim 1, wherein the semiconductor component is a thyristor component and said semiconductor body has formed therein a plurality of structural components including at least one gate electrode, one cathode, and one anode.

7. The semiconductor component according to claim 6, wherein the thyristor component is a multiple stage thyristor including at least one main thyristor and at least one auxiliary thyristor.

8. The semiconductor component according to claim 6, wherein said thyristor component is an annular thyristor component, and said structural components in a plane of the surface of the semiconductor body are annular structures selected from the group consisting of circular, circular-annular, and polygonal.

9. The semiconductor component according to claim 1, wherein the semiconductor component has a center region defined on said semiconductor body, and including a voltage break-over protection in the center region.

10. The semiconductor component according to claim 1, wherein the semiconductor component is a thyristor with a periphery, and said semiconductor body having recesses formed therein at the periphery of the thyristor for creating a peripheral structure.

11. The semiconductor component according to claim 1, wherein the semiconductor component is a multiple stage thyristor including at least one main thyristor and at least two auxiliary thyristors, and wherein said lateral resistor region is disposed between said at least two auxiliary thyristors.

12. The semiconductor component according to claim 1, wherein the semiconductor component is a multiple stage thyristor including at least one main thyristor and at least one auxiliary thyristor, and wherein said lateral resistor region is disposed between said at least one auxiliary thyristors and said main thyristor.

13. The semiconductor component according to claim 1, wherein the semiconductor component is a multiple stage thyristor including at least one main thyristor and at least two auxiliary thyristors, and wherein said lateral resistor region is one of at least two lateral resistor regions respectively disposed between said at least two auxiliary thyristors and between one of said auxiliary thyristors and said main thyristor.

* * * * *